United States Patent
Tel et al.

(10) Patent No.: US 11,415,899 B2
(45) Date of Patent: Aug. 16, 2022

(54) METHOD OF DETERMINING A FOCUS OF A PROJECTION SYSTEM, DEVICE MANUFACTURING METHOD, AND APPARATUS FOR DETERMINING A FOCUS OF A PROJECTION SYSTEM

(71) Applicant: ASML NETHERLANDS B.V., Veldhoven (NL)

(72) Inventors: Wim Tjibbo Tel, Helmond (NL); Bart Laenens, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/499,349

(22) PCT Filed: Apr. 5, 2018

(86) PCT No.: PCT/EP2018/058674
§ 371 (c)(1),
(2) Date: Sep. 30, 2019

(87) PCT Pub. No.: WO2018/206199
PCT Pub. Date: Nov. 15, 2018

(65) Prior Publication Data
US 2021/0096474 A1    Apr. 1, 2021

Related U.S. Application Data

(60) Provisional application No. 62/503,724, filed on May 9, 2017.

(51) Int. Cl.
*G03F 7/20*      (2006.01)

(52) U.S. Cl.
CPC ...... *G03F 7/70641* (2013.01); *G03F 7/70625* (2013.01)

(58) Field of Classification Search
CPC .. G03F 7/70641; G03F 7/70625; G03F 7/705; G03F 7/70516; G03F 7/70633;
(Continued)

(56) References Cited

U.S. PATENT DOCUMENTS

| | | |
|---|---|---|
| 2013/0108146 A1 | 5/2013 | Li |
| 2016/0363871 A1 | 12/2016 | Van Oosten et al. |

OTHER PUBLICATIONS

International Search Report and Written Opinion issued in corresponding PCT Patent Application No. PCT/EP2018/058674, dated Jul. 26, 2018.
(Continued)

*Primary Examiner* — Mesfin T Asfaw
(74) *Attorney, Agent, or Firm* — Pillsbury Winthrop Shaw Pittman LLP (57) ABSTRACT

Methods and apparatus for determining a focus of a projection system are disclosed. In one arrangement, a method includes obtaining first data derived from a first measurement of one or more selected properties of a target pattern formed on a substrate by exposing the substrate using the projection system. The first measurement is performed before the substrate is etched based on the target pattern. The method further includes obtaining second data derived from a second measurement of the one or more selected properties of the target pattern. The second measurement is performed after the substrate is etched based on the target pattern. The method further includes determining the focus of the projection system using the first data and the second data.

20 Claims, 8 Drawing Sheets

(58) Field of Classification Search
CPC ............ G03F 7/70616; G03F 7/70508; G03F 7/70683; G03F 7/7065; G03F 9/7046; G03F 7/70525; G03F 7/70491; G03F 7/706; G03F 1/44; G01B 11/24
See application file for complete search history.

(56) References Cited

OTHER PUBLICATIONS

Charley, Anne-Laure, et al.: "High speed optical metrology solution for after etch process monitoring and control", Proc. of SPIE, vol. 9050, Apr. 2, 2014.

METHOD OF DETERMINING A FOCUS OF A PROJECTION SYSTEM, DEVICE MANUFACTURING METHOD, AND APPARATUS FOR DETERMINING A FOCUS OF A PROJECTION SYSTEM

CROSS-REFERENCE TO RELATED APPLICATIONS

This application is the U.S. national phase entry of PCT patent application no. PCT/EP2018/058674, filed on Apr. 5, 2018, which claims the benefit of priority of U.S. provisional application No. 62/503,724, which was filed on May 9, 2017, both of which are incorporated herein in their entirety by reference.

FIELD

The present description relates to determining focus, particularly of a projection system of a lithographic apparatus.

BACKGROUND

A lithographic apparatus is a machine that applies a desired pattern onto a substrate, usually onto a target portion of the substrate. A lithographic apparatus can be used in one or more stages of a device manufacturing process, such as in the manufacture of integrated circuits (ICs). In that instance, a patterning device, which is alternatively referred to as a mask or a reticle, may be used to generate a pattern to be formed on an individual layer of the device. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

In order to monitor a device manufacturing process, a focus of a projection system of the lithographic apparatus is typically measured. Besides the focus of the projection system also focus variations due to substrate unflatness and substrate positioning accuracy with respect to the focus of the projection system may need to be measured. In general a focus of the lithographic apparatus is considered to comprise all possible contributions to a quality of focus of the projection system with respect to a substrate subject to a lithographic process, for example the projection system, substrate unflatness and limitations on the positioning accuracy of the substrate within the lithographic apparatus.

Targets that are specially adapted for focus measurements may be formed for this purpose on the substrate. The targets may comprise sub-resolution features to create diffraction effects. In an example arrangement, sub-resolution comb-like structures are provided on one side of a line in a target to create asymmetric side wall asymmetry, which is useful for measuring focus. Various other structures can be used. It is challenging, however, to provide targets for focus that are both effective for measuring focus and acceptable for end users of the lithographic apparatus. In particular, end user design rules may not be compatible with focus targets that use sub-resolution features or with focus targets that involve large pitches between features (e.g. lines) in the focus targets It is desirable to provide methods for measuring focus which address one or more of the above or other issues.

According to an aspect, there is provided a method of determining a focus of a lithographic apparatus, the method comprising: obtaining first data derived from a first measurement of one or more selected properties of a target pattern formed on a substrate by exposing the substrate using the projection system, wherein the first measurement is performed before the substrate is etched; obtaining second data derived from a second measurement of the one or more selected properties of the target pattern, wherein the second measurement is performed after the substrate is etched; and determining the focus of the lithographic apparatus using the first data and the second data.

According to an aspect, there is provided an apparatus for measuring a focus of a lithographic apparatus, the apparatus comprising: a measurement system configured to: 1) obtain first data by performing a first measurement of one or more selected properties of a target pattern formed on a substrate by exposing the substrate using the projection system, wherein the first measurement is performed before the substrate is etched; and 2) obtain second data by performing a second measurement of the one or more selected properties of the target pattern, wherein the second measurement is performed after the substrate is etched; and a data processing unit configured to determine the focus of the lithographic apparatus using the first data and the second data.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments may be implemented.

Figure 1:
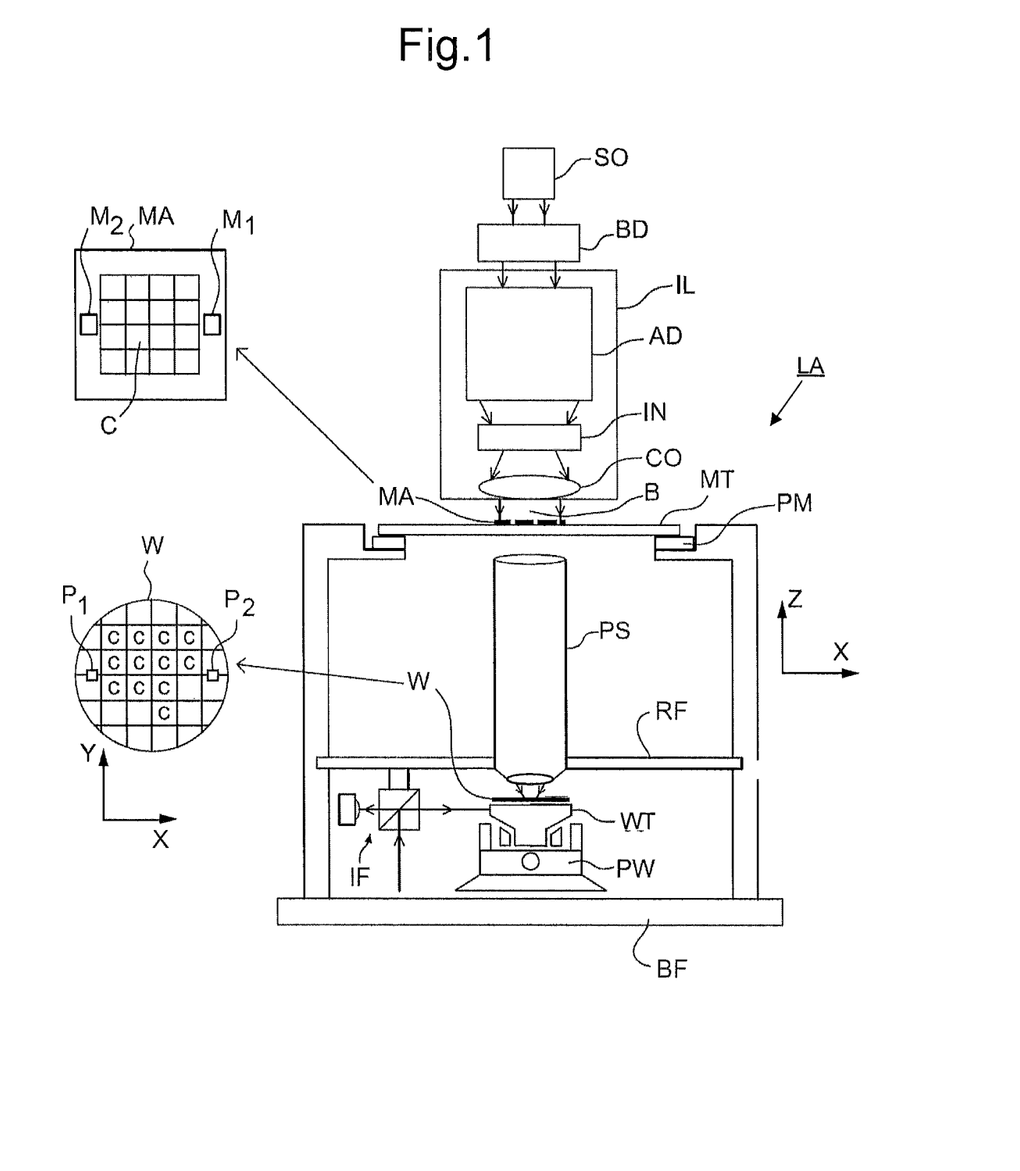
FIG. 1 schematically depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables below the projection system and, for example, two or more patterning device tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust an angular or spatial intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask MA), which is held on the support structure (e.g., mask table MT), and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the patterning device table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device table MT and the substrate table WT are scanned synchronously while a pattern imparted to the radiation beam is projected onto a target portion C (i.e., a single dynamic exposure). The velocity and direction of the substrate table WT relative to the patterning device table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
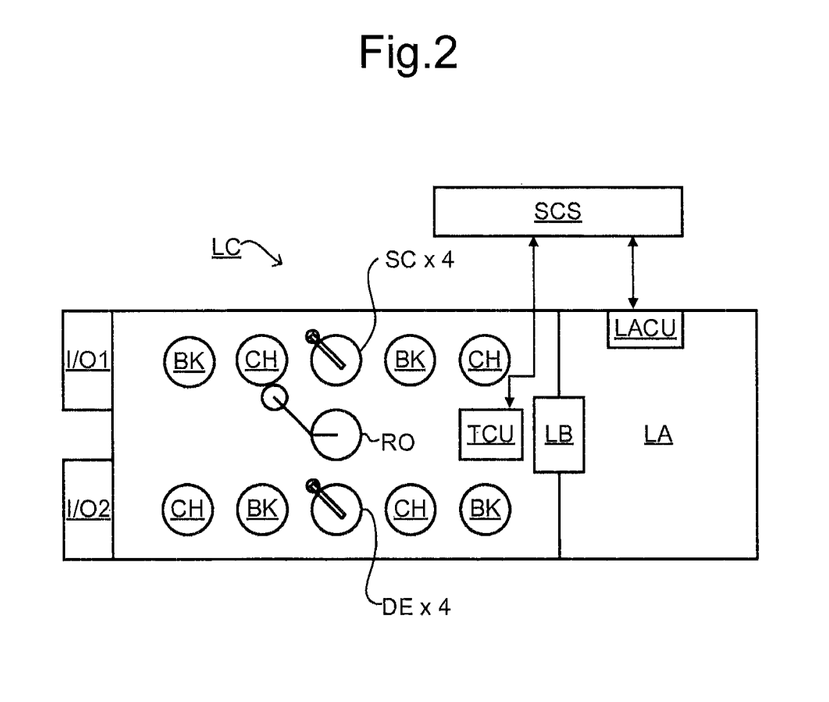
FIG. 2 schematically depicts a lithographic cell or cluster.

As shown in FIG. 2 the lithographic apparatus LA forms part of a lithographic cell LC, also sometimes referred to as a lithocell or cluster, which also includes apparatus to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO picks up substrates from input/output ports I/O1, I/O2, moves them between the different process apparatuses and delivers them to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure one or more properties, such as an overlay error between subsequent layers, a line thickness, a critical dimension (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

An inspection apparatus, which may also be referred to as a metrology apparatus, is used to determine the one or more properties of the substrates, and in particular, how the values of the one or more properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure a property in the exposed resist layer immediately after the exposure. However, the latent image in the resist has a very low contrast, as in there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching.

As mentioned, a target pattern may be provided that is specifically configured for determining a focus of the projection system. It may be undesirable for such a target pattern to contain features that are not fully compatible with end user requirements, such as a target pattern with sub-resolution features or a target pattern having a pitch that is too large. Methods are described herein that allow high quality focus determinations to be made even when a target pattern does not comprise sub-resolution features or has features having a large pitch (although these can still be used if desired). The methods are not strongly dependent on details of the target pattern and may be used with a wide variety of target patterns.

Figure 3:
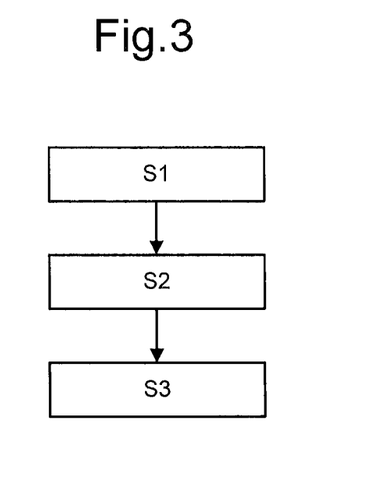
FIG. 3 depicts a method of determining a focus of a projection system.
Figure 13:
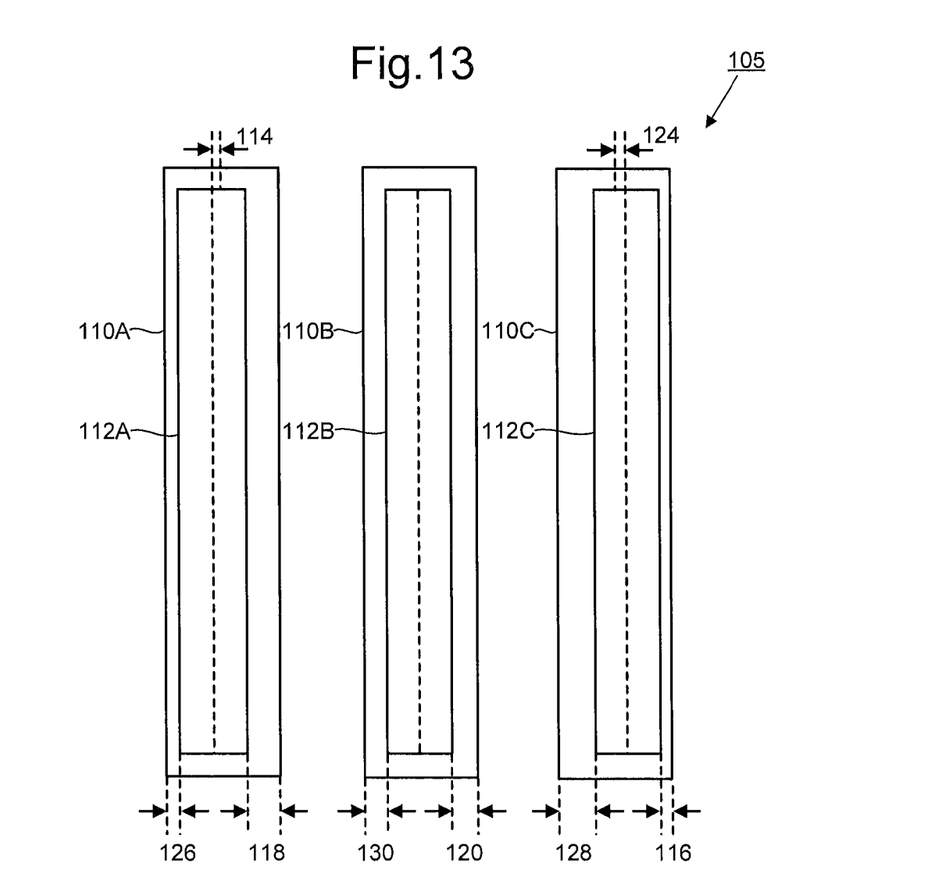
FIG. 13 schematically depicts an example target pattern before and after etching of a substrate based on the target pattern.

In an embodiment, as depicted in FIG. 3, there is provided a method of determining a focus of a projection system PS. The projection system PS may be as described above with reference to FIG. 1, optionally forming part of a lithographic apparatus LA such as that described above with reference of FIG. 1. The method comprises obtaining, at S1, first data derived from a first measurement of one or more selected properties of a target pattern 105. In an embodiment, the method comprises performing the first measurement. An example target pattern 105 is shown in FIG. 13. The target pattern 105 is formed by exposing a substrate W using the projection system PS. The first measurement is performed before the substrate W is etched based on the target pattern 105. In an embodiment, the first measurement is performed immediately after exposure on a latent image of the target pattern in the resist. Alternatively or additionally, the first measurement is performed after a post-exposure bake (on a semi-latent image of the target pattern). Alternatively or additionally, the first measurement is performed after a development step, for example after either the exposed or unexposed parts of a resist have been removed.

The method further comprises obtaining, at S2, second data derived from a second measurement of the one or more selected properties (i.e. the same one or more selected properties) of the target pattern 105. The second measurement is performed after the substrate W is etched based on the target pattern 105.

The method further comprises determining, at S3, a focus of the projection system PS using the first data and the second data.

The focus can be determined particularly efficiently when information is used both from measurements before etching and measurements after etching. For example, as shown below, the combination of such measurements can provide a monotonically varying calibration curve, enabling essentially unambiguous determination of focus.

In an embodiment, the determination at S3 of the focus uses calibration data. The calibration data may be obtained, for example, from measurements carried out at an earlier time, optionally on a different substrate or plurality of substrates. The calibration data provides a relationship between the position of the focus of the projection system PS with respect to the position of the substrate and a combination of the one or more selected properties of the target pattern 105 prior to etching of the substrate W based on the target pattern 105 with the one or more properties of the target pattern 105 after etching of the substrate W based on the target pattern 105. The calibration data may take any of the various forms known in the art, for example a look up table or one or more mathematical formulae representing a fitting that has been applied to data obtained from calibration measurements. In an embodiment, the calibration data is obtained by measuring the one or more selected properties of the target pattern 105 before the substrate W is etched based on the target pattern 105 and measuring the one or more selected properties of the target pattern 105 after the substrate W is etched based on the target pattern, for different known focuses of the projection system PS. In an embodiment, the combination of selected properties before and after etching comprises a difference between before etching and after etching of one or more of the selected properties. The effectiveness of this approach is demonstrated by the example experimental results shown in FIGS. 4-12, in which a critical dimension of the target pattern 105 is used as the selected property of the target pattern 105. So, in this example, the combination of one or more selected properties before and after etching comprises a difference in the CD before and after etching.

Figure 4:
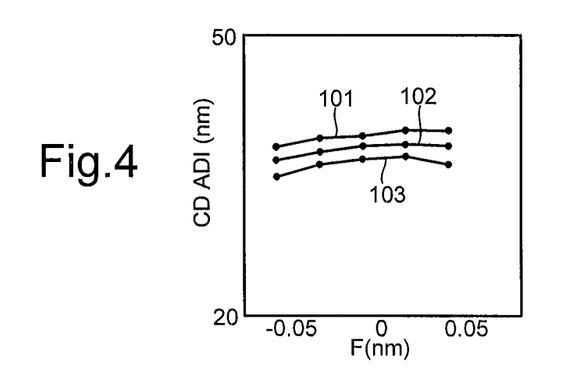
FIG. 4 is a graph showing a variation of measured critical dimension (CD) with focus for an example target pattern having a 98 nm pitch, prior to etching of the substrate based on the target pattern.
Figure 5:
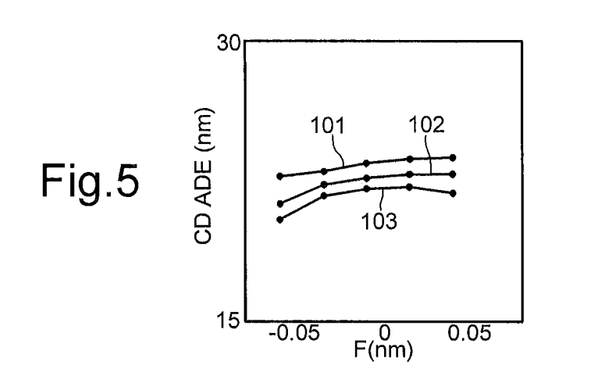
FIG. 5 is a graph showing a variation of measured CD with focus for the example target pattern of FIG. 4 after etching of the substrate based on the target pattern.
Figure 6:
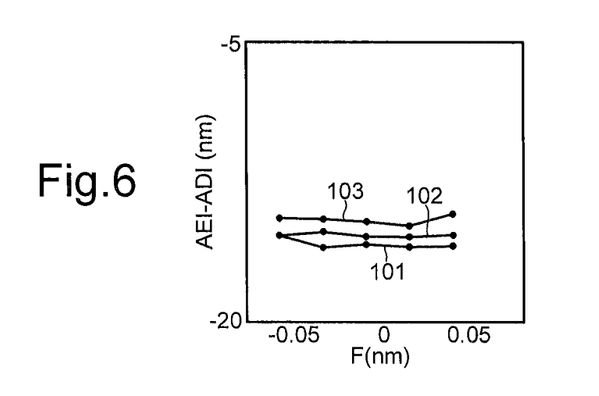
FIG. 6 is a graph showing a variation with focus of a difference between the measured CD of FIG. 4 and the measured CD of FIG. 5.

FIG. 4 depicts three curves 101-103 showing a measured variation with focus (F) of CD in a target pattern 105 after development but prior to etching (CD ADI). The three curves 101-103 correspond to different dose levels. A pitch of the target pattern 105 was 98 nm. FIG. 5 depicts the same measurements after the target pattern has been etched (CD AEI). FIG. 6 depicts a variation with focus of a difference between the measurements of FIG. 4 and FIG. 5 (AEI-ADI).

Figure 7:
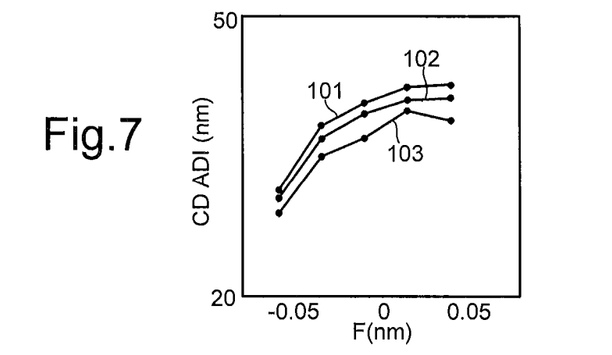
FIG. 7 is a graph showing a variation of measured CD with focus for an example target pattern having a 160 nm pitch, prior to etching of the substrate based on the target pattern.
Figure 8:
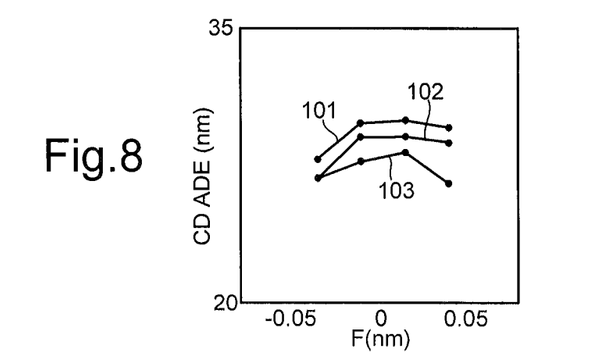
FIG. 8 is a graph showing a variation of measured CD with focus for the example target pattern of FIG. 7 after etching of the substrate based on the target pattern.
Figure 9:
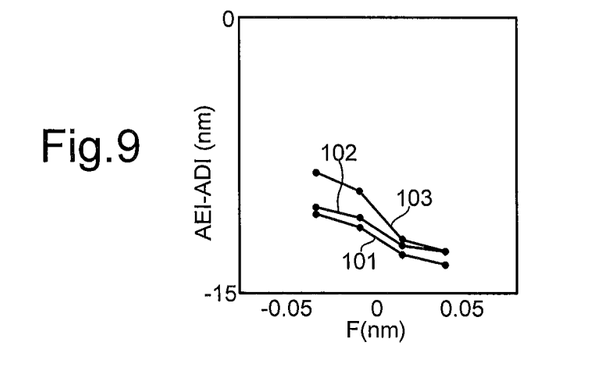
FIG. 9 is a graph showing a variation with focus of a difference between the measured CD of FIG. 7 and the measured CD of FIG. 8.
Figure 10:
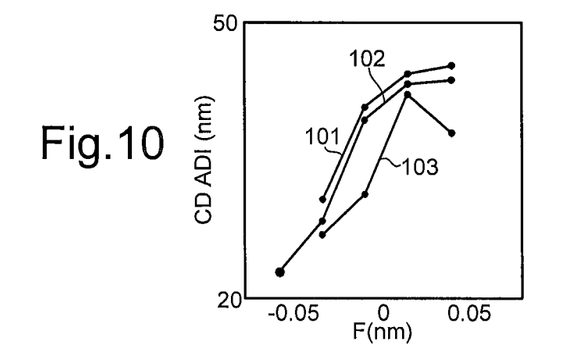
FIG. 10 is a graph showing a variation of measured CD with focus for an example target pattern having a 440 nm pitch, prior to etching of the substrate based on the target pattern.
Figure 11:
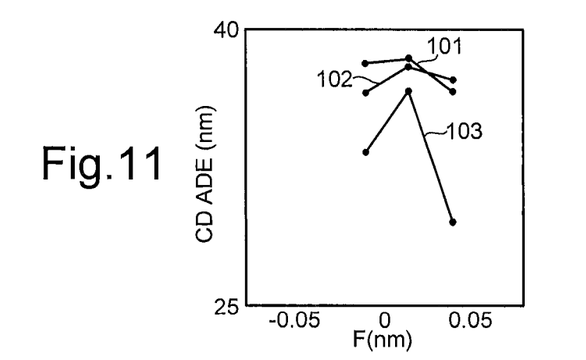
FIG. 11 is a graph showing a variation of measured CD with focus for the example target pattern of FIG. 10 after etching of the substrate based on the target pattern.
Figure 12:
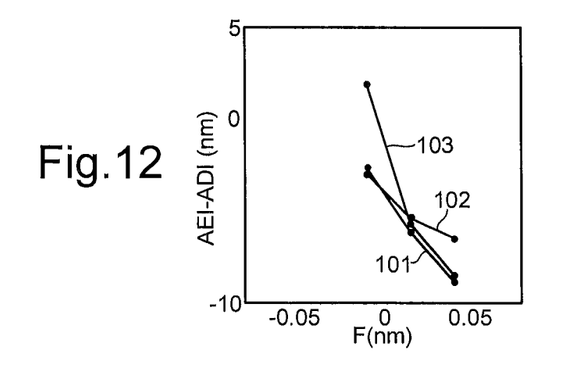
FIG. 12 is a graph showing a variation with focus of a difference between the measured CD of FIG. 10 and the measured CD of FIG. 11.

FIGS. 7-9 correspond to FIGS. 4-6 except that the pitch of the target pattern 105 was 160 nm. FIGS. 10-12 correspond to FIGS. 4-6 and 7-9 except that the pitch of the target pattern 105 was 440 nm.

It can be seen from FIGS. 4-12 that the variation of the difference AEI-ADI with focus is both more monotonic and more linear than the variations of either ADI or AEI against focus (which are both roughly quadratic). The curves of AEI-ADI with focus thus provide efficient calibration curves for determining focus from measurements of AEI and ADI. The monotonic nature of the variations avoids ambiguity in the correspondence between AEI-ADI and focus. There will only be one value of focus corresponding to each value of AEI-ADI. The approximately linear relationship provides a simple calibration curve. The steepness of the calibration curve varies according to the pitch of the target pattern 105. The curve of AEI-ADI against focus in FIG. 12 is steeper than the curve of AEI-ADI against focus of FIGS. 6 and 9 for example. The steepness of the calibration curve also varies as a function of the dose level. In an embodiment either or both of the pitch of the target pattern 105 and the dose level are selected to provide a suitable variation of AEI-ADI with focus. In the particular example of FIGS. 4-12, for example, a target pattern 105 of 440 nm pitch and a dose level corresponding to curve 103 of FIG. 12 may be selected to provide a steep curve of AEI-ADI against focus, thereby providing relatively high sensitivity.

In an embodiment, the first measurement and the second measurement are performed using one or more further target patterns 105 having different pitches to the target pattern 105. The determination at S3 of the focus is performed using the first measurements and second measurements from the one or more further target patterns 105. Using information from a plurality of different target patterns 105 may improve the accuracy of the determination of focus.

In an embodiment, the first measurement and the second measurement are performed using one or more further target patterns 105 exposed using different dose levels. The determination at S3 of the focus is performed using the first measurements and second measurements from the one or more further target patterns 105.

The geometry of the target pattern 105 and the nature of the one or more selected properties of the target pattern 105 are not particularly limited, as long as the selected property shows a suitable variation as a function of focus. The method can be implemented without special features in the target pattern 105 (such as sub-resolution features or a large pitch), which may be undesirable or unacceptable for end users. In the particular example discussed above with reference to FIGS. 4-12, a shift in the critical dimension of a target pattern is used. In other embodiments, a shift in a different feature of the target pattern 105 may be used. In one class of embodiments, the shift comprises a shift in the position of a feature of the target pattern after the substrate W is etched based on the target pattern 105 in comparison with the position of the same feature of the target pattern 105 before the substrate W is etched based on the target pattern. The feature may be a portion of an edge in the target pattern or a center of gravity of a feature of the target pattern 105. FIGS. 13-17, discussed below, illustrate various shifts in the positions of edges of lines and centers of gravity that can be used for determining focus according to embodiments of the present disclosure, either individually or in combination.

FIG. 13 schematically depicts an example target pattern 105 comprising three bars. The target pattern 105 is shown both before etching and after etching of the substrate W based on the target pattern 105. Outlines of the three bars before etching are labeled 110A-C. Outlines of the three bars after etching are labeled 112A-C. The etching process in this example causes a reduction in the width of each of the bars, together with a shift to the left of the leftmost bar and a shift to the right of the rightmost bar. Shifts in any of the edges that are vertical in the plane of the page in FIG. 13 could be used to determine focus. Alternatively or additionally, a shift in the position of a center of gravity of one of the outer bars relative to the center of gravity of the central bar could be used. FIGS. 14-17 show that many of the edge shifts and/or center of gravity shifts of the three bar pattern of FIG. 13 show strong monotonic variations with focus and could therefore be used to implement the method of determining focus.

Figure 14:
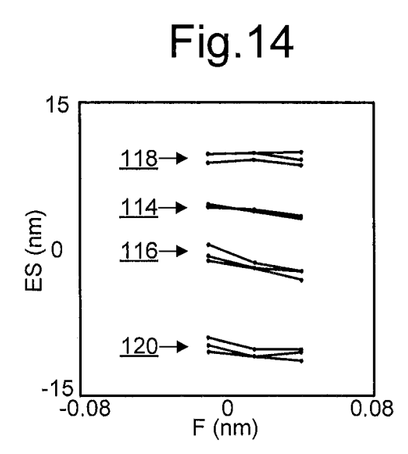
FIG. 14 is a graph showing a measured variation of four different types of edge shift to the left of a three bar target pattern such as that depicted in FIG. 13, at three different dose levels, as a function of focus, the target pattern having a pitch of 113 nm.
Figure 15:
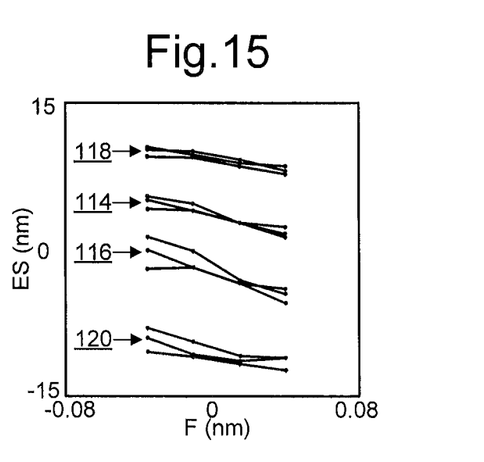
FIG. 15 is a graph showing a measured variation of four different types of edge shift to the left of a three bar target pattern such as that depicted in FIG. 13, at three different dose levels, as a function of focus, the target pattern having a pitch of 133 nm.

FIG. 14 depicts edge shifts (ES) of the target pattern 105 to the left for three different dose levels and for a target pattern 105 having a pitch of 113 nm. FIG. 15 depicts the same edge shifts for a target pattern 105 having a pitch of 133 nm. Shifts (for three different dose levels) of the center of gravity of the leftmost bar to the left relative to the central bar are labeled 114 in FIGS. 13-15. Shifts (for three different dose levels) of the rightmost edge of the rightmost bar to the left are labeled 116 in FIGS. 13-15. Shifts (for three different dose levels) of the rightmost edge of the leftmost bar to the left are labeled 118 in FIGS. 12-15. Shifts (for three different dose levels) of the rightmost edge of the central bar to the left are labeled 120 in FIGS. 13-15.

Figure 16:
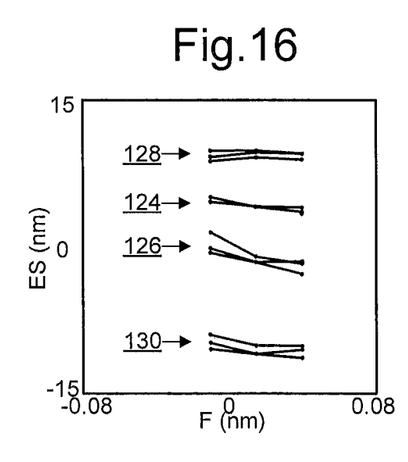
FIG. 16 is a graph showing a measured variation of four different types of edge shift to the right of a three bar target pattern such as that shown in FIG. 13, at three different dose levels, as a function of focus, the target pattern having a pitch of 113 nm.
Figure 17:
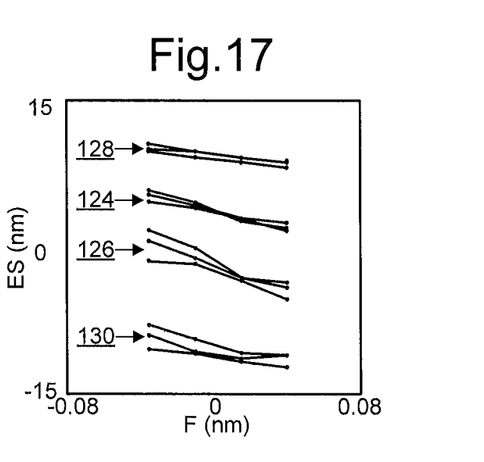
FIG. 17 is a graph showing a measured variation of four different types of edge shift to the right of a three bar target pattern such as that shown in FIG. 13, at three different dose levels, as a function of focus, the target pattern having a pitch of 133 nm.

FIG. 16 depicts edge shifts (ES) of the target pattern 105 to the right for three different dose levels and for a target pattern 105 having a pitch of 113 nm. FIG. 17 depicts the same edge shifts for a target pattern 105 having a pitch of 133 nm. Shifts (for three different dose levels) of the center of gravity of the rightmost bar to the right relative to the central bar are labeled 124 in FIGS. 13, 16 and 17. Shifts (for three different dose levels) of the leftmost edge of the leftmost bar to the right are labeled 126 in FIGS. 13, 16 and 17. Shifts (for three different dose levels) of the leftmost edge of the rightmost bar to the right are labeled 128 in FIGS. 13, 16 and 17. Shifts (for three different dose levels) of the leftmost edge of the central bar to the right are labeled 130 in FIGS. 13, 16 and 17.

All of the shifts depicted in FIGS. 15 and 17 show approximately linear and monotonic variation with focus. All of the shifts except shifts 118 and 128 depicted in FIGS. 14 and 16 show approximately linear and monotonic variation with focus.

Figure 18:
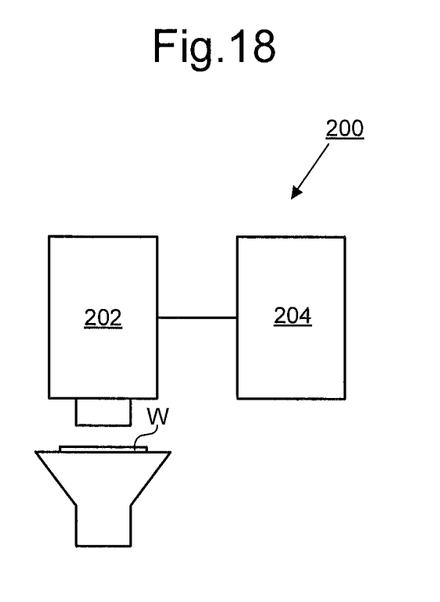
FIG. 18 schematically depicts an apparatus for measuring a focus of a projection system.

In an embodiment, as depicted schematically in FIG. 18, an apparatus 200 is provided for performing the method of determining a focus. The apparatus 200 comprises a measurement system 202. The measurement system 202 performs the first measurement to obtain the first data as described above. The measurement system 202 performs the second measurement to obtain the second data as described above. The apparatus 200 further comprises a data processing unit 204 that determines a focus of a projection system PS using the first data and the second data as described above. Computer hardware for implementing such functionality (when suitably programmed) is known in the art. A computer program may be provided that when run on the data processing unit 204 (e.g. a computer) causes the data processing unit 204 to perform a method according to any of the above-described embodiments.

In an embodiment, methods of embodiments of the disclosure are used as part of a device manufacturing method. A lithographic apparatus comprising a projection system is used to form a device structure on a substrate using a lithographic process. A result of the determination of the focus according to any of the above-described embodiments is used to, for example, control (e.g. improve a focus of) the lithographic process.

Further embodiments of the invention are disclosed in the list of numbered embodiments below:

1. A method of determining a focus of a projection system in a lithographic apparatus, the method comprising:

obtaining first data derived from a first measurement of a property of a target pattern formed on a substrate by exposing the substrate using the projection system, wherein the first measurement is performed before the substrate is etched based on the target pattern;

obtaining second data derived from a second measurement of the property of the target pattern, wherein the second measurement is performed after the substrate is etched based on the target pattern; and determining the focus of the projection system using the first data and the second data.

2. The method of embodiment 1, wherein the determination of the focus uses calibration data providing a relationship between the focus of the projection system and a combination of 1) the property of the target pattern before the substrate is etched based on the target pattern, with 2) the property of the target pattern after the substrate is etched based on the target pattern.

3. The method of embodiment 2, wherein the combination comprises a difference between before etching of the substrate and after etching of the substrate of the property of the target pattern.

4. The method of embodiment 3, wherein the difference comprises a difference between before etching of the substrate and after etching of the substrate of a critical dimension of the target pattern.

5. The method of any of embodiments 2-4, further comprising obtaining the calibration data by measuring the property of the target pattern before the substrate is etched based on the target pattern and measuring the property of the target pattern after the substrate is etched based on the target pattern, for different known focuses of the projection system.

6. The method of any of embodiments 2-5, wherein the combination comprises a shift in the position of a feature of the target pattern after the substrate is etched based on the target pattern in comparison with the position of the feature of the target pattern before the substrate is etched based on the target pattern.

7. The method of any preceding embodiment, further comprising performing the first measurement to obtain the first data.

8. The method of any preceding embodiment, further comprising performing the second measurement to obtain the second data.

9. A device manufacturing method comprising:

using the method of any preceding embodiment to determine a focus of a projection system; and using a lithographic apparatus comprising the projection system to form a device structure on a substrate using a lithographic process, wherein a result of the determination of the focus is used to control the lithographic process.

10. An apparatus configured to determine a focus of a projection system, the apparatus comprising:

a measurement system configured to: 1) obtain first data by performing a first measurement of a property of a target pattern formed on a substrate by exposing the substrate using the projection system, wherein the first measurement is performed before the substrate is etched based on the target pattern; and 2) obtain second data by performing a second measurement of the property of the target pattern, wherein the second measurement is performed after the substrate is etched based on the target pattern; and a data processing unit configured to determine the focus of the projection system using the first data and the second data.

11. The apparatus of embodiment 10, wherein the data processing unit is configured to receive calibration data providing a relationship between the focus of the projection system and a combination of the property of the target pattern before the substrate is etched based on the target pattern with the property of the target pattern after the substrate is etched based on the target pattern, and use the calibration data to perform the determination of the focus.

12. The apparatus of embodiment 11, wherein the combination comprises a difference between before etching of the substrate and after etching of the substrate of the property of the target pattern.

13. The apparatus of embodiment 12, wherein the difference comprises a difference between before etching of the substrate and after etching of the substrate of a critical dimension of the target pattern.

14. The apparatus of any of embodiments 11-13, wherein the combination comprises a shift in the position of a feature of the target pattern after the substrate is etched based on the target pattern in comparison with the position of the feature of the target pattern before the substrate is etched based on the target pattern.

15. A computer program comprising computer readable instructions which when run on a computer cause the computer to perform the method of any of embodiments 1-8.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

An embodiment of the invention may take the form of a computer program containing one or more sequences of machine-readable instructions to cause performance of a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present description has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

Although specific reference may have been made above to the use of embodiments of the invention in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), soft X-ray, as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a focus of a lithographic apparatus, the method comprising:
   obtaining first data derived from a first measurement of a property of a target pattern formed on a substrate by exposing the substrate using the lithographic apparatus, wherein the first measurement is performed before the substrate is etched;
   obtaining second data derived from a second measurement of the property of the target pattern, wherein the second measurement is performed after the substrate is etched; and
   determining, by a hardware computer system and using the first data and the second data, a value of focus of the lithographic apparatus used to form the target pattern, the determined value representing focus of an optical system as well as any substrate unflatness and/or any positioning inaccuracy of the substrate.

2. The method of claim 1, wherein the focus is associated with a projection system in the lithographic apparatus.

3. The method of claim 2, wherein the first measurement is performed before the substrate is etched based on the target pattern and wherein the second measurement is performed after the substrate is etched based on the target pattern.

4. The method of claim 3, wherein the determination of the focus uses calibration data providing a relationship between the focus of the projection system and a combination of 1) the property of the target pattern as obtained before the substrate is etched based on the target pattern, with 2) the property of the target pattern as obtained after the substrate is etched based on the target pattern.

5. The method of claim 4, wherein the combination comprises a difference between the property of the target pattern as obtained before etching of the substrate and the property of the target pattern as obtained after etching of the substrate.

6. The method of claim 5, wherein the difference comprises a difference between a critical dimension of the target pattern as obtained before etching of the substrate and a critical dimension of the target pattern as obtained after etching of the substrate.

7. The method of claim 4, further comprising obtaining the calibration data by measuring the property of the target pattern before the substrate is etched based on the target pattern and measuring the property of the target pattern after the substrate is etched based on the target pattern, for different known focuses of the projection system.

8. The method of claim 4, wherein the combination comprises a shift in the position of a feature of the target pattern after the substrate is etched based on the target pattern in comparison with the position of the feature of the target pattern before the substrate is etched based on the target pattern.

9. A device manufacturing method comprising:
using the method of claim 3 to determine a focus of a projection system; and
using a lithographic apparatus comprising the projection system to form a device structure on a substrate using a lithographic process, wherein a result of the determination of the focus is used to control the lithographic process.

10. An apparatus configured to determine a focus of a lithographic apparatus, the apparatus comprising:
a measurement system configured to: 1) obtain first data by performing a first measurement of a property of a target pattern formed on a substrate by exposing the substrate using the projection system, wherein the first measurement is performed before the substrate is etched; and 2) obtain second data by performing a second measurement of the property of the target pattern, wherein the second measurement is performed after the substrate is etched; and
a data processing unit configured to determine, using the first data and the second data, a value of focus of the lithographic apparatus used to form the target pattern, the determined value representing focus of an optical system as well as any substrate unflatness and/or any positioning inaccuracy of the substrate.

11. The apparatus of claim 10, wherein the data processing unit is configured to receive calibration data providing a relationship between the focus of the projection system and a combination of the property of the target pattern before the substrate is etched with the property of the target pattern after the substrate is etched, and use the calibration data to perform the determination of the focus.

12. The apparatus of claim 11, wherein the combination comprises a difference between the property of the target pattern as obtained before etching of the substrate and the property of the target pattern as obtained after etching of the substrate.

13. The apparatus of claim 12, wherein the difference comprises a difference between a critical dimension of the target pattern as obtained before etching of the substrate and a critical dimension of the target pattern as obtained after etching of the substrate.

14. The apparatus of claim 11, wherein the combination comprises a shift in the position of a feature of the target pattern after the substrate is etched in comparison with the position of the feature of the target pattern before the substrate is etched.

15. A computer program product comprising a non-transitory computer-readable medium having computer readable instructions therein, the instructions, upon executing by a computer system, configured to cause the computer system to at least:
obtain first data derived from a first measurement of a property of a target pattern formed on a substrate by exposing the substrate using a lithographic apparatus, wherein the first measurement is performed before the substrate is etched;
obtain second data derived from a second measurement of the property of the target pattern, wherein the second measurement is performed after the substrate is etched; and
determine, using the first data and the second data, an unknown value of focus of the lithographic apparatus physically occurring within the lithographic apparatus at the time the lithographic apparatus is used to form the target pattern.

16. The computer program product of claim 15, wherein the first measurement is performed before the substrate is etched based on the target pattern and wherein the second measurement is performed after the substrate is etched based on the target pattern.

17. The computer program product of claim 15, wherein the determination of the focus uses calibration data providing a relationship between the focus of the lithographic apparatus and a combination of 1) the property of the target pattern as obtained before the substrate is etched, with 2) the property of the target pattern as obtained after the substrate is etched.

18. The computer program product of claim 17, wherein the combination comprises a difference between the property of the target pattern as obtained before etching of the substrate and the property of the target pattern as obtained after etching of the substrate.

19. The computer program product of claim 18, wherein the difference comprises a difference between a critical dimension of the target pattern as obtained before etching of the substrate and a critical dimension of the target pattern as obtained after etching of the substrate.

20. The computer program product of claim 17, wherein the instructions are further configured to cause the computer system to obtain the calibration data by obtaining measurements of the property of the target pattern before the substrate is etched and measurements of the property of the target pattern after the substrate is etched, for different known focuses of the lithographic apparatus.

* * * * *